(12) United States Patent
Di Sessa et al.

(10) Patent No.: US 7,656,923 B2
(45) Date of Patent: Feb. 2, 2010

(54) DUAL DIODE CONVERGING MODULE

(75) Inventors: Alexandre B. Di Sessa, Walnut Creek, CA (US); Mihai I. A. Boitor, Martinez, CA (US)

(73) Assignee: ZAP Lasers, LLC, Pleasant Hill, CA (US)

( * ) Notice: Subject to any disclaimer, the term of this patent is extended or adjusted under 35 U.S.C. 154(b) by 4 days.

(21) Appl. No.: 12/115,383

(22) Filed: May 5, 2008

(65) Prior Publication Data

US 2009/0274179 A1    Nov. 5, 2009

(51) Int. Cl.
*H01S 5/22*    (2006.01)
(52) U.S. Cl. .................. 372/50.121; 372/23; 372/50.12; 372/50.122; 607/89
(58) Field of Classification Search .................... 372/23, 372/50.12–50.122; 607/89
See application file for complete search history.

(56) References Cited

U.S. PATENT DOCUMENTS

| | | | |
|---|---|---|---|
| 4,350,960 A * | 9/1982 | Matthews et al. ......... 372/46.01 |
| 5,304,172 A | 4/1994 | Manoukian et al. |
| 5,464,436 A | 11/1995 | Smith |
| 5,607,420 A | 3/1997 | Schuman |
| 5,616,141 A | 4/1997 | Cipolla |
| 5,927,977 A | 7/1999 | Sale et al. |
| 5,928,220 A | 7/1999 | Shimoji |
| 6,013,096 A | 1/2000 | Tucek |
| 6,039,565 A | 3/2000 | Chou et al. |
| 6,099,520 A | 8/2000 | Shimoji |
| 6,108,359 A * | 8/2000 | Tatsuta ......................... 372/36 |
| 6,213,998 B1 | 4/2001 | Shen et al. |
| 6,231,567 B1 | 5/2001 | Rizoiu et al. |
| 6,254,597 B1 | 7/2001 | Rizoiu et al. |
| 6,261,310 B1 | 7/2001 | Neuberger et al. |
| 6,325,791 B1 | 12/2001 | Shimoji |
| 6,327,942 B1 | 12/2001 | Mariol et al. |
| 6,458,120 B1 | 10/2002 | Shen et al. |
| 6,572,637 B1 | 6/2003 | Yamazaki et al. |
| 6,574,401 B2 | 6/2003 | Neuberger et al. |
| 6,746,473 B2 | 6/2004 | Shanks et al. |
| D496,101 S | 9/2004 | Davison |
| 6,826,214 B2 * | 11/2004 | Nomoto ....................... 372/36 |
| 6,868,221 B1 | 3/2005 | Wood et al. |
| 6,916,316 B2 * | 7/2005 | Jay .............................. 606/9 |
| 7,033,350 B2 | 4/2006 | Bahk |
| 7,118,563 B2 | 10/2006 | Weckwerth et al. |
| 7,137,977 B2 | 11/2006 | Brucker et al. |
| 7,267,672 B2 | 9/2007 | Altshuler et al. |
| 7,288,086 B1 | 10/2007 | Andriasyan |
| 7,290,940 B2 | 11/2007 | Boutoussov |
| 7,320,594 B1 | 1/2008 | Rizoiu et al. |
| 2002/0014579 A1 * | 2/2002 | Dunfield ..................... 250/216 |
| 2004/0156743 A1 * | 8/2004 | Bornstein ..................... 422/22 |
| 2004/0259053 A1 | 12/2004 | Bekov et al. |
| 2005/0151244 A1 * | 7/2005 | Chrysler et al. ............. 257/713 |
| 2007/0023521 A1 * | 2/2007 | Wildey et al. ............... 235/454 |

FOREIGN PATENT DOCUMENTS

WO    WO 01/10327 A1    2/2001

* cited by examiner

*Primary Examiner*—Minsun Harvey
*Assistant Examiner*—Michael Carter
(74) *Attorney, Agent, or Firm*—Charles L. Thoeming

(57) ABSTRACT

An improved, dual diode convergence module which focuses the light energy of at least two separate diode chip laser wavelengths of into a single beam and, thus, which derives the benefit of both wavelengths.

11 Claims, 4 Drawing Sheets

DUAL DIODE CONVERGING MODULE

CROSS-REFERENCES TO RELATED APPLICATIONS

None.

STATEMENT REGARDING FEDERALLY SPONSORED RESEARCH OR DEVELOPMENT

None.

REFERENCE TO A MICRO-FICHE APPENDIX

None.

BACKGROUND OF THE INVENTION

1. Field of the Invention

This invention relates to optically controlled integrated circuit lasers. More particularly, the invention relates to an improved, dual diode convergence module which focuses the light energy of at least two separate diode chip laser wavelengths of into a single beam and thus derive the benefits of both wavelengths.

2. Description of the Related Art including Information Disclosed under 37 C.F.R. 1.97 and 1.98

A search of the prior art located the following United States patents which are believed to be representative of the present state of the prior art: U.S. Pat. No. 6,325,791 B1, issued Dec. 4, 2001; U.S. Pat. No. 6,458,120 B1, issued Oct. 1, 2002; U.S. Pat. No. 6,213,998 B1, issued Apr. 10, 2001; U.S. Pat. No. 7,118,563, issued Oct. 10, 2006; U.S. Pat. No. 5,616,141, issued Apr. 1, 1997; U.S. Pat. No. 5,607,420, issued Mar. 4, 1997; U.S. Pat. No. 6,013,096, issued Jan. 11, 2000; U.S. Pat. No. 5,464,436, issued Nov. 7, 1995; U.S. Pat. No. 5,304,172, issued Apr. 19, 1994; U.S. Pat. No. 7,033,350 B2, issued Apr. 25, 2006; U.S. Pat. No. 6,572,637 B1, issued Jun. 3, 2003; U.S. Pat. No. 6,574,401 B1, issued Jun. 3, 2003; U.S. Pat. No. 6,868,221 B1, issued Mar. 15, 2005; U.S. Pat. No. 6,261,310 B1, issued Jul. 17, 2001; U.S. Pat. No. 7,267,672 B2, issued Sep. 11, 2007; U.S. Patent Publication 2004/0259053 A1, published Dec. 23, 2004; U.S. Pat. No. 5,927,977, issued Jul. 27, 1999; U.S. Pat. No. 6,746,473 B2, issued Jun. 8, 2004; and International Patent Publication No. WO 01/10327 A1, published Feb. 15, 2001.

BRIEF SUMMARY OF THE INVENTION

Semiconductor diode lasers have been in practice for nearly forty-five years. During this period considerable development has evolved in the testing and implementation of light emitting semiconductor diodes.

Regular laser diodes produce only a single laser beam having a particular wavelength. They do not simultaneously emit two different wavelengths. Accordingly, the application of regular laser diodes is limited.

Desirability of a multiple beam semiconductor laser has been recognized previously. However, do to resultant thermal crosstalk between closely spaced laser diodes, practical inter-laser spacings have generally been limited.

Accordingly it would be useful to provide a converging module whereby the beams from at least two separate diode laser chips are converged into a single beam.

It would be of further benefit to provide a converging module whereby to simultaneously derive the benefits of the wavelengths of at least two separate diode laser chips.

Another desired aspect for a converging module whereby the beams from at least two separate diode laser chips are converged into a single beam would be to incorporate the technology into portable, hand-held devices for medical procedures.

It would be of further use if the converging module whereby the beams from at least two separate diode laser chips are converged into a single beam focused the single beam into a detachable cylinder containing the fiber optic.

Other features, advantages, and objects of the present invention will become apparent with reference to the following description and accompanying drawings.

DETAILED DESCRIPTION OF THE INVENTION

Figure 1:
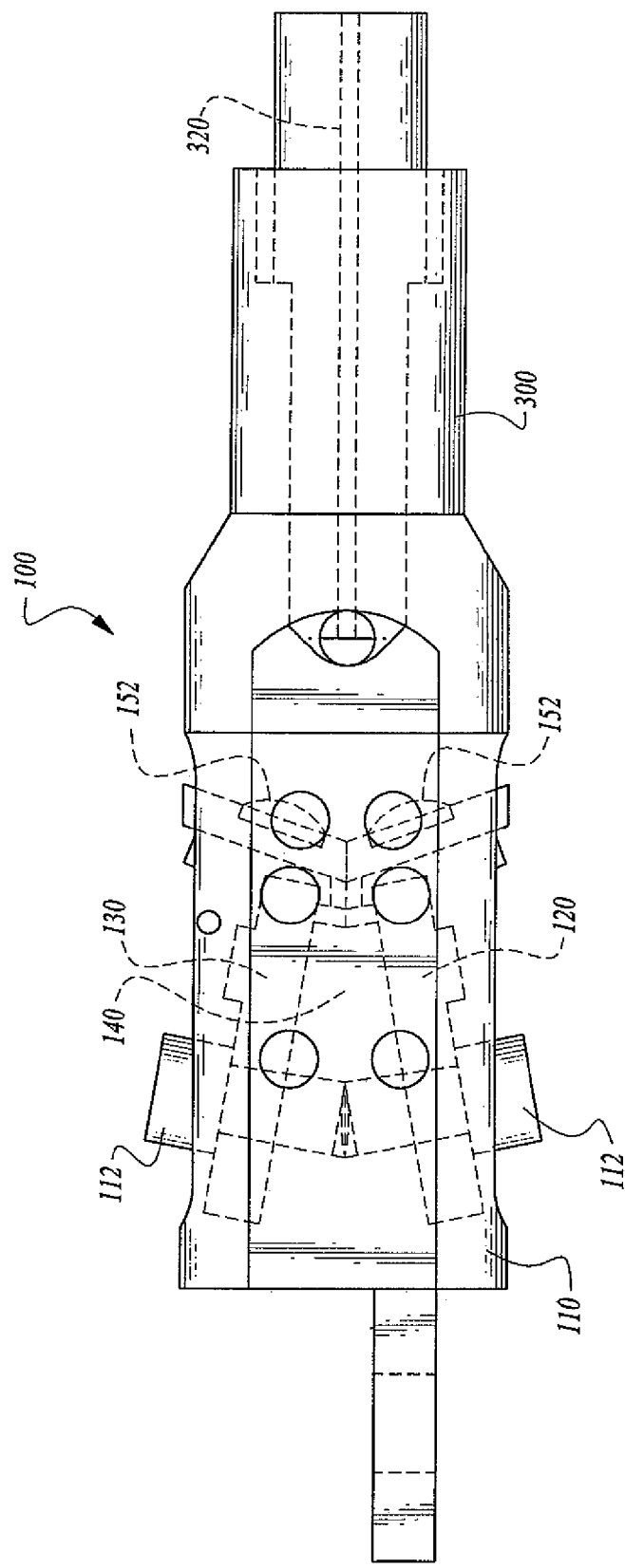
FIG. 1 is a top view of an embodiment of a dual diode converging module 100 comprising in combination a base housing 110, control elements 112, diode laser chips 120 and 130, laser mounting block 140, focusing lens block 150, aspheric lens 152, and fiber optic housing unit 300.
Figure 2:
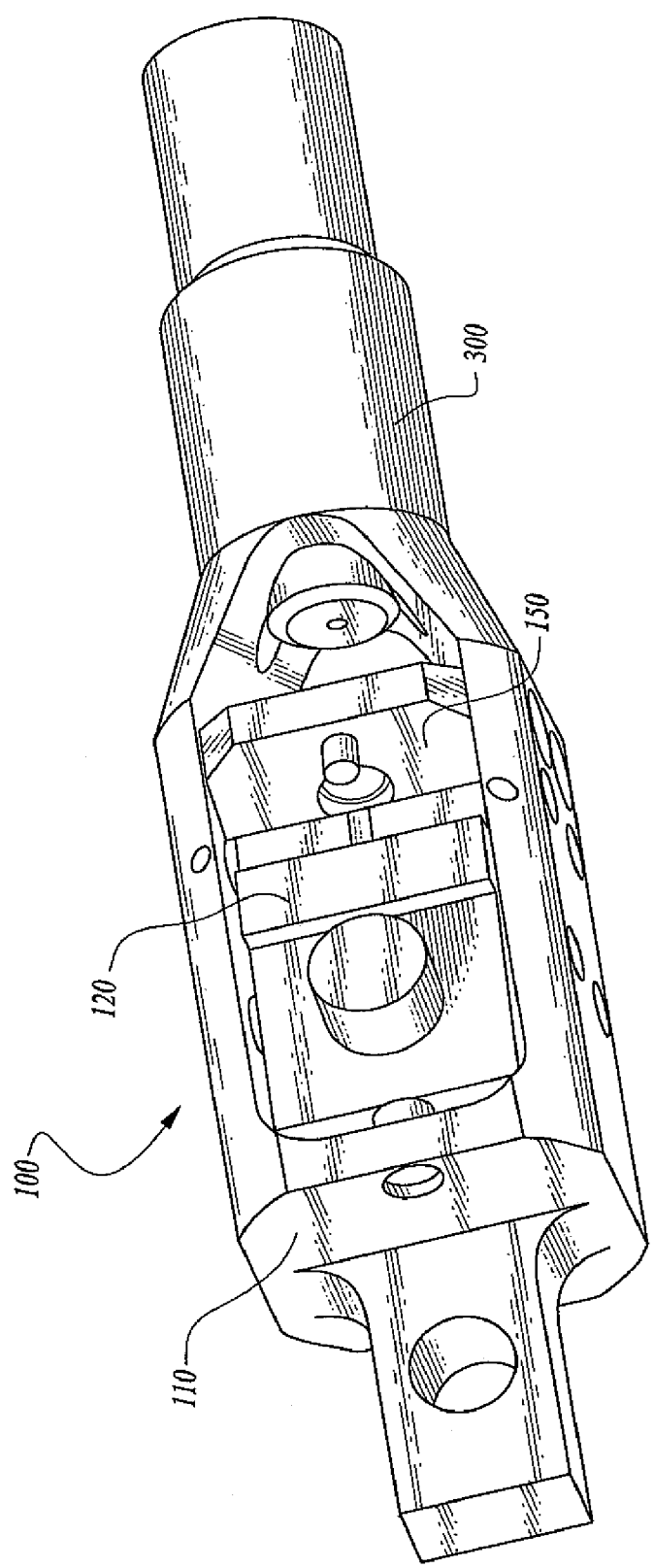
FIG. 2 is a perspective view of an embodiment of a dual diode converging module 100 depicting the base housing 110, a diode laser chip 120, focusing lens block 150, and fiber optic housing unit 300.
Figure 3:
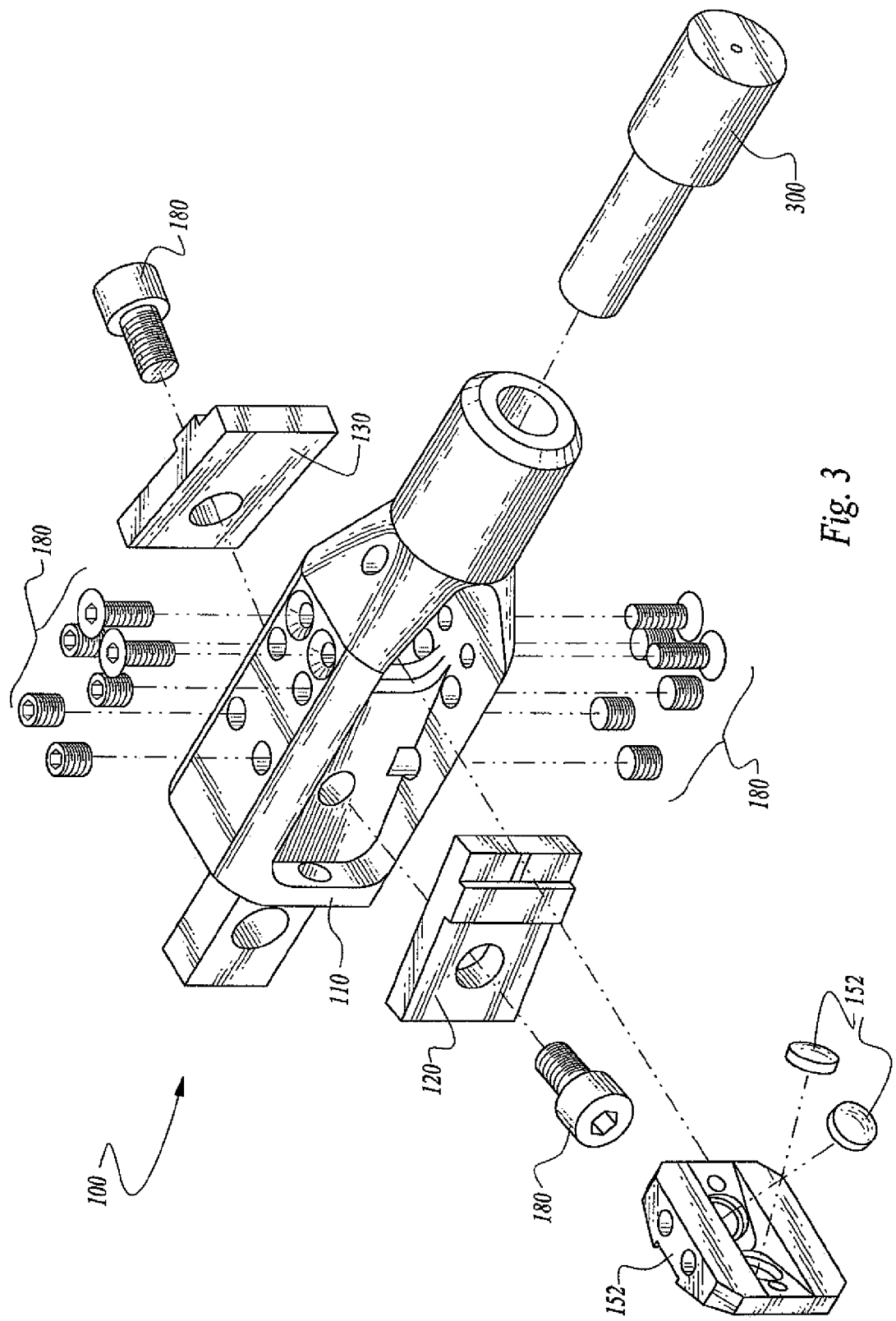
FIG. 3 is an exploded perspective view of an embodiment of a dual diode converging module 100 comprising in combination a base housing 110, control elements 112, diode laser chips 120 and 130, laser mounting block 140, focusing lens block 150, aspheric lens 152, calibration set screws 180, and fiber optic housing unit 300.
Figure 4:
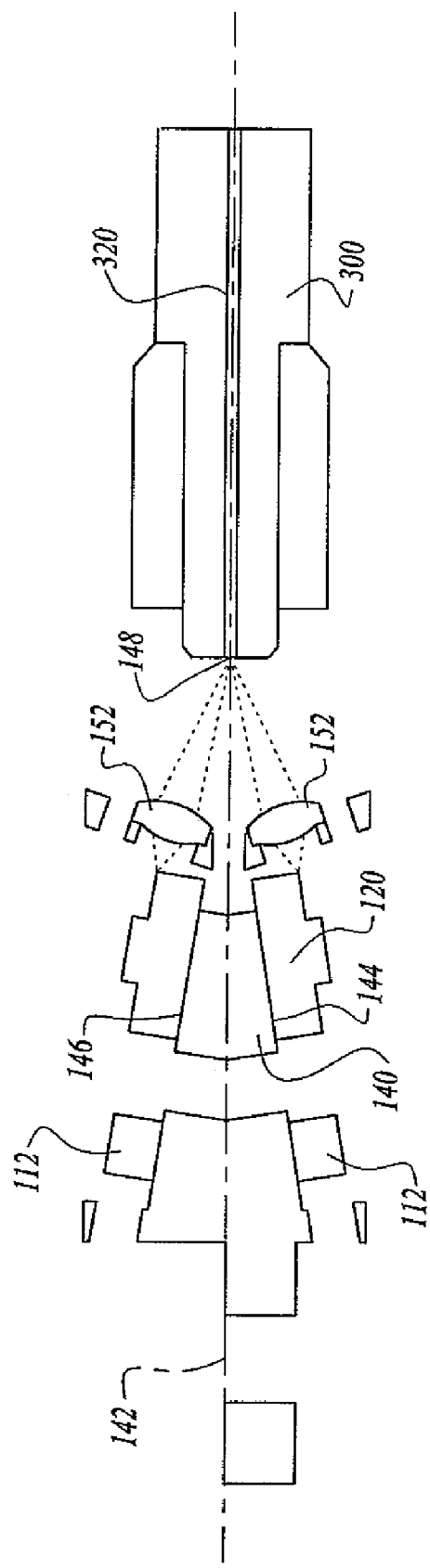
FIG. 4 is a detail top view of an embodiment of a dual diode converging module 100 comprising in combination control elements 112, diode laser chips 120 and 130, laser mounting block 140, aspheric lenses 152, and fiber optic housing unit 300.

With reference to drawing FIGS. 1-4, a dual diode chip laser converging module 100, is presented. The dual diode chip laser converging module 100 comprises a base housing 110 containing control assembly 112 for at least two diode chip lasers, 120 and 130, each laser emitting a diode chip laser output beam having a separate wavelength. Within the housing 110 and interposed between the diode chip lasers, 120 and 130, is an assembly for spacing the diode laser chips and aligning each respective diode chip laser output beam. The housing 110 further provides a separate assembly for focusing each diode chip laser output beam, and an assembly for calibrating each diode chip laser output beam focusing assembly.

An embodiment of the dual diode chip laser converging module 100 comprises in combination: 1) a base housing 110 containing control elements 112 for control of at least two diode chip lasers, 2) diode chip lasers 120 and 130 each emitting a diode chip laser output beam having a separate wavelength, 3) laser mounting block 140 for spacing the diode chip lasers, 120 and 130, and aligning each respective diode chip laser output beam, 4) focusing lens block 150 comprising aspheric lens 152 for each diode chip laser output beam, and 5) calibration set screws 180.

An embodiment of the dual diode chip laser converging module 100 provides diode chip laser output beam infrared light at an optimal wavelength of 800 nm, and at most a wavelength of 980 nm.

For an embodiment of the dual diode chip laser converging module 100, the separate assembly for focusing each diode chip laser output beam comprises at least one aspheric lens housed within a lens housing assembly. The lens housing assembly 150 is housed within the base housing 110. The lens housing assembly 150 and contained aspheric lenses 152 focus the infrared light energy to the end of an optical fiber 320 within the fiber optic housing unit 300.

In an embodiment of the dual diode chip laser converging module, the base housing 110 of further comprises a laser mounting block 140 having a centerline 142 and at least two side surfaces 144 and 146 of equal acute angle orientation to the mounting block centerline 142. The mounting block is thus interposed between diode chip lasers, 120 and 130, spacing the diode chip lasers and aligning the respective diode chip laser output beams towards a focal point 148 at the end of an optical fiber 320 within the fiber optic housing unit 300. Heat sink paste is used to dissipate the heat between diode chip lasers, 120 and 130.

An embodiment of the dual diode chip laser converging module 100 provides an assembly for calibrating each diode chip laser output beam focusing assembly using at least one set screw 180 communicating with each diode chip laser, 120 and 130, and the mounting block 140 for spacing the diode laser chips aligning the respective diode chip laser output beams towards a focal point 148 at the end of an optical fiber 320 within the fiber optic housing unit 300. The assembly for each diode chip laser output beam focusing assembly further comprises at least one set screw 180 communicating with the lens housing assembly 150 and the base housing 110. The assembly for calibrating each diode chip laser output beam focusing means further comprises at least one set screw 180 communicating with the laser mounting block 140 and base housing 110. The apparatus 100 is tuned and calibrated by hand using a power meter.

For an embodiment of the dual diode chip laser converging module 110, at least one microprocessor controls the output of two diode chip lasers, 120 and 130.

For an embodiment of the apparatus 100, at least one laser chip 120 generates an optimal output infrared light wavelength of 800, and at most 980 nm.

For an embodiment of the apparatus 100, at least one laser chip 130 generates an optimal output infrared light wavelength of 800, and at most 980 nm.

For a preferred embodiment of the apparatus 100, the base housing 110, laser mounting block 140, and focusing lens block are aluminum with standard heat sink paste dissipation material.

We claim:

1. A dual diode chip laser converging module comprising:
   a) a base housing containing means for control of at least two diode chip lasers;
   b) at least two diode laser chips each emitting a diode chip laser output beam having a separate wavelength, wherein at least one diode chip laser output beam comprises infrared light of an optimal wavelength of 800 nm;
   c) means within the housing and interposed between the diode laser chips for spacing the diode laser chips and aligning each respective diode chip laser output beam;
   d) separate means for focusing each diode chip laser output beam; and
   e) means for calibrating each diode chip laser output beam focusing means.

2. The dual diode chip laser converging module of claim 1, wherein each diode chip laser output beam comprises infrared light of at least a wavelength of 800 nm, and at most a wavelength of 980 nm.

3. The dual diode chip laser converging module of claim 1 wherein the separate means for focusing each diode chip laser output beam comprises at least one aspheric lens housed within means for lens housing, wherein means for lens housing is housed within the base housing.

4. The dual diode chip laser converging module of claim 1, wherein the means within the housing and interposed between the diode laser chips for spacing the diode laser chips and aligning the respective diode chip laser output beams comprises a laser mounting block having a centerline and at least two side surfaces of acute angle orientation to the mounting block centerline, whereby at least two diode laser chips are affixed to the mounting block side surfaces with the direction of each emitting a diode chip laser output beam oriented towards the block centerline and a corresponding separate means for focusing the output beam.

5. The dual diode chip laser converging module of claim 1, wherein the means for calibrating each diode chip laser output beam focusing means comprises at least one set screw communicating with each diode chip laser and means within the housing and interposed between the diode laser chips for spacing the diode laser chips aligning the respective diode chip laser output beams.

6. The dual diode chip laser converging module of claim 5, wherein the means for calibrating each diode chip laser output beam focusing means further comprises at least one set screw communicating with means for lens housing and the base housing.

7. The dual diode chip laser converging module of claim 4, wherein the means for calibrating each diode chip laser output beam focusing means further comprises at least one set screw communicating with the laser mounting block and base housing.

8. The dual diode chip laser converging module of claim 1, wherein means for control of at least two diode chip lasers comprises at least one microprocessor.

9. The dual diode chip laser converging module of claim 1, further comprising heat sink paste between at least two diode laser chips.

10. A dual diode chip laser converging module comprising:
   a) a base housing containing at least one microprocessor;
   b) at least two diode laser chips each controlled by at least one microprocessor, each chip emitting a diode chip laser output beam having a separate wavelength, and each chip having heat sink paste between it and any adjacent diode laser chip, wherein at least one diode chip laser output beam comprises infrared light of an optimal wavelength of 800 nm;
   c) a laser mounting block having a centerline and at least two side surfaces of acute angle orientation to the mounting block centerline, whereby at least two diode laser chips are affixed to the mounting block side surfaces with the direction of each emitting diode chip laser output beam oriented towards a point on the block centerline;
   d) at least one aspheric lens housed within means for lens housing;
   e) at least one set screw communicating with each diode chip laser and the laser mounting block;
   f) at least one set screw communicating with means for lens housing and the base housing.

11. The dual diode chip laser converging module of claim 10, wherein each diode chip laser output beam comprises infrared light of at least a wavelength of 800 nm, and at most a wavelength of 980 nm.

* * * * *